US012256528B2

(12) United States Patent
Chang et al.

(10) Patent No.: US 12,256,528 B2
(45) Date of Patent: Mar. 18, 2025

(54) COMPACT STATIC RANDOM-ACCESS MEMORY STRUCTURE

(71) Applicant: Taiwan Semiconductor Manufacturing Company, Ltd., Hsinchu (TW)

(72) Inventors: Ruey-Wen Chang, Hsinchu (TW); Feng-Ming Chang, Hsinchu County (TW); Ping-Wei Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 516 days.

(21) Appl. No.: 17/461,426

(22) Filed: Aug. 30, 2021

(65) Prior Publication Data
US 2023/0068359 A1 Mar. 2, 2023

(51) Int. Cl.
*H10B 10/00* (2023.01)
*G11C 11/412* (2006.01)
*H01L 27/092* (2006.01)

(52) U.S. Cl.
CPC .......... *H10B 10/12* (2023.02); *G11C 11/412* (2013.01); *H01L 27/0924* (2013.01)

(58) Field of Classification Search
CPC ...... H10B 10/00–18; H01L 2924/1437; G11C 11/41–419
See application file for complete search history.

(56) References Cited

U.S. PATENT DOCUMENTS 8,878,307 B2 * 11/2014 Miyata .............. H01L 21/76895
257/393
2022/0406715 A1 * 12/2022 Xie ....................... H01L 29/775

OTHER PUBLICATIONS

Huan-Chieh Su et al., "Backside Power Rail And Methods Of Forming The Same," U.S. Appl. No. 16/901,963, filed Jun. 15, 2020, Assignee: Taiwan Semiconductor Manufacturing Co., Ltd., 29 pages specification, 22 pages drawings.
Lung-Kun Chu et al., "Self-Aligned Backside Source Contact Structure," U.S. Appl. No. 17/016,109, filed Sep. 9, 2020, Assignee: Taiwan Semiconductor Manufacturing Co., Ltd., 31 pages specification, 17 pages drawings.
Yi-Bo Liao, et al., "Source/Drain Contact Structure," U.S. Appl. No. 17/093,230, filed Nov. 9, 2020, Assignee: Taiwan Semiconductor Manufacturing Co., Ltd., 50 pages specification, 57 pages drawings.

* cited by examiner

*Primary Examiner* — Tucker J Wright
(74) *Attorney, Agent, or Firm* — HAYNES AND BOONE, LLP

(57) ABSTRACT

A static random-access memory (SRAM) structure and the manufacturing method thereof are disclosed. An exemplary SRAM structure includes a first source/drain (S/D) feature and a second S/D feature formed in an interlayer dielectric layer (ILD) of a bit cell region of the SRAM structure, a frontside via electrically connecting to the first S/D feature, and a first backside via electrically connecting to the second S/D feature. The first S/D feature and the second S/D feature are of a same type.

20 Claims, 16 Drawing Sheets

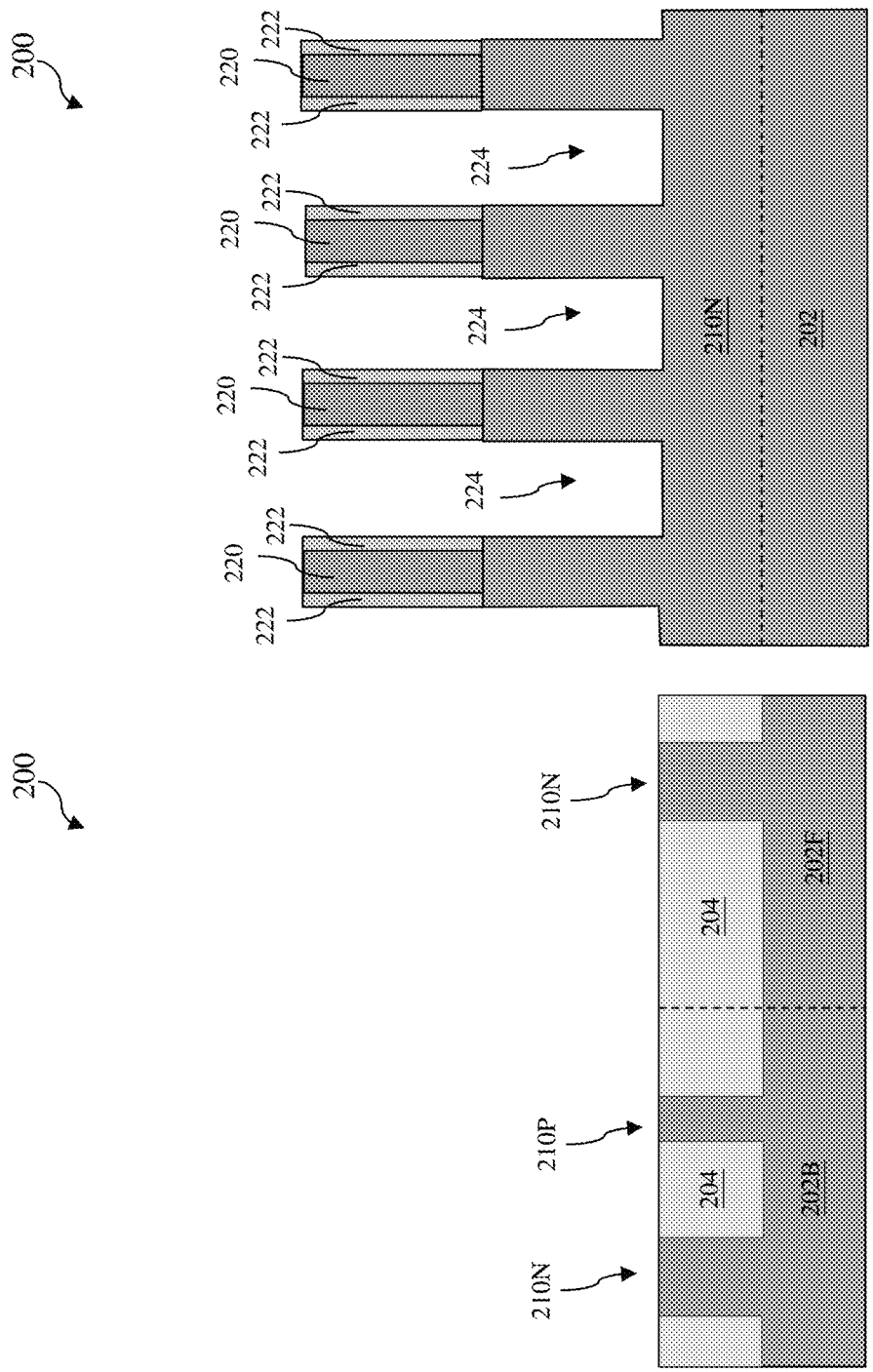

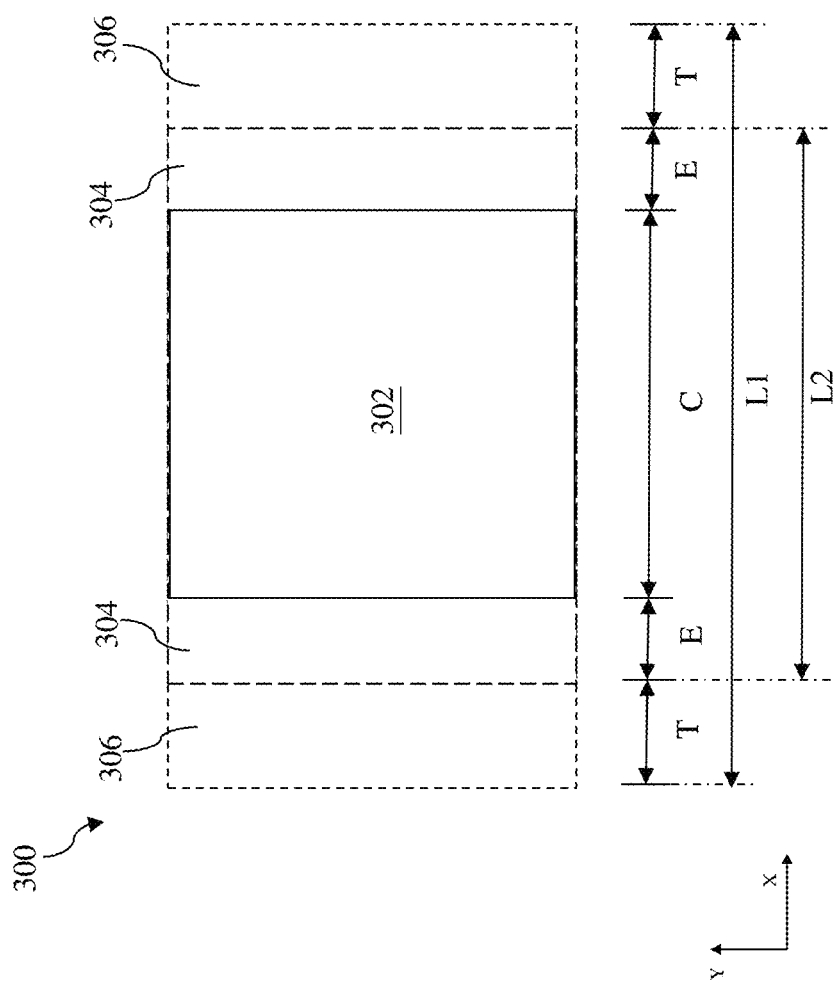

COMPACT STATIC RANDOM-ACCESS MEMORY STRUCTURE

BACKGROUND

The integrated circuit (IC) industry has experienced exponential growth. In the course of IC evolution, functional density (i.e., the number of interconnected devices per chip area) has generally increased while geometry size (i.e., the smallest component (or line) that can be created using a fabrication process) has decreased.

One specific type of IC structure used to store data in a computer or other electronic devices is static random-access memory (SRAM). An SRAM can hold data without a need for refreshing. A typical SRAM structure includes bit cell region and edge region. The bit cell region includes cell arrays performing the core function of reading and writing and the edge region provides support to the bit cell region. Edge regions of some SRAM structures include tap cells to avoid the latch-up issue of the SRAM. However, the tap cells usually take a large area in the edge region, which increase the geometry size of the SRAM structure. Thus, improvements to reduce the size of the SRAM structure are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 5A-15A illustrate cross-sectional views of the example SRAM structure along line A-A' in FIGS. 3A, 3B, and 4, at intermediate stages of the method 100 of FIG. 1, in accordance with some embodiments of the present disclosure.

FIGS. 5B-15B illustrate cross-sectional views of the example SRAM structure along line B-B' in FIGS. 3A, 3B, and 4, at intermediate stages of the method 100 of FIG. 1, in accordance with some embodiments of the present disclosure.

FIG. 16 illustrates an SRAM bit cell according to some embodiments of the present disclosure.

DETAILED DESCRIPTION

Figure 1:
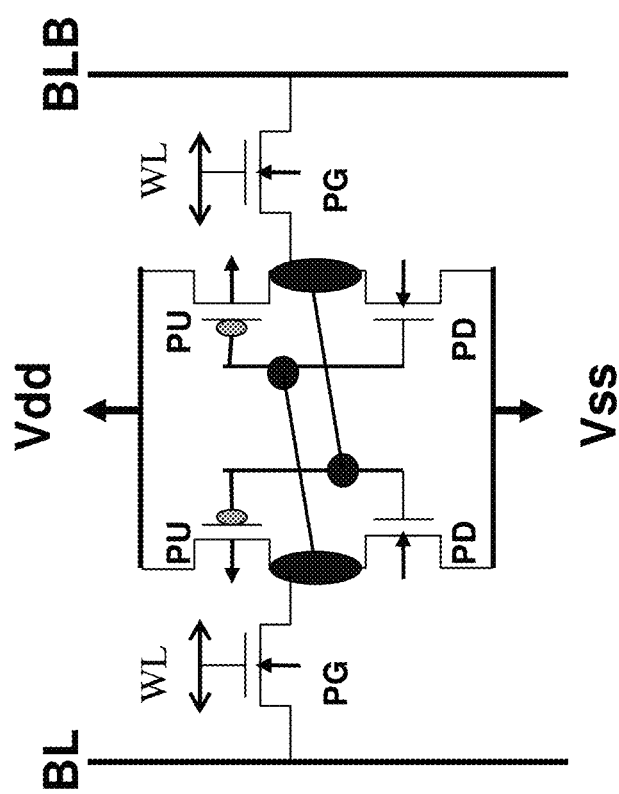
FIG. 1 illustrates a schematic view of a six-transistor (6T) SRAM cell.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating SRAM, such as an SRAM structure formed with three-dimensional semiconductor transistors, such as fin-like field-effect transistors (FinFETs) or nanostructure transistors.

As illustrated in FIG. 1, a 6T SRAM cell typically includes two P-type pull-up (PU) transistors, two N-type pull-down (PD) transistors, and two N-type pass-gate (PG) transistors. The PD transistors form cross-coupled inverters with the PU transistors. The two inverters are cross-coupled to form data storage nodes. The PG transistors are coupled to the data storage nodes for writing thereto and reading therefrom. FIG. 1 further shows word line (WL), bit line (BL), and bit line bar (BLB) for accessing the data storage nodes of the SRAM 200, and positive supply voltage Vdd and negative supply voltage (or ground) Vss.

In some technologies, active regions of semiconductor devices are disposed over N-type well regions and the P-type well regions in a substrate. A p-type well region adjacent an n-type well region may form a P-N junction. Forward bias to the P-N junction may cause a latch-up issue, and thereby damage the whole chip. To avoid this issue, tap cells are used in the SRAM structure to provide reverse bias to the P-N junction. In some SRAM structures, the tap cells are formed in the edge region of the SRAM structure. The edge region with tap cells can have a width of 6 critical poly pitch (CPP, i.e. the pitch distance between the adjacent gate structures, see FIG. 3A, 3B, or 5B) to 10 CPP, which increase the geometry size of the SRAM structure.

The present disclosure provides an SRAM structure without tap cells. In the present disclosure, source/drain (S/D) features in the bit cell regions are connected to the Vss or Vdd from the backside. The backside connections can provide the function as the tap cells, i.e. solving the latch-up issue, therefore no tap cells are needed in the edge portion of the SRAM structure. And, the geometry size of the SRAM structure can thus be reduced.

Figure 2:
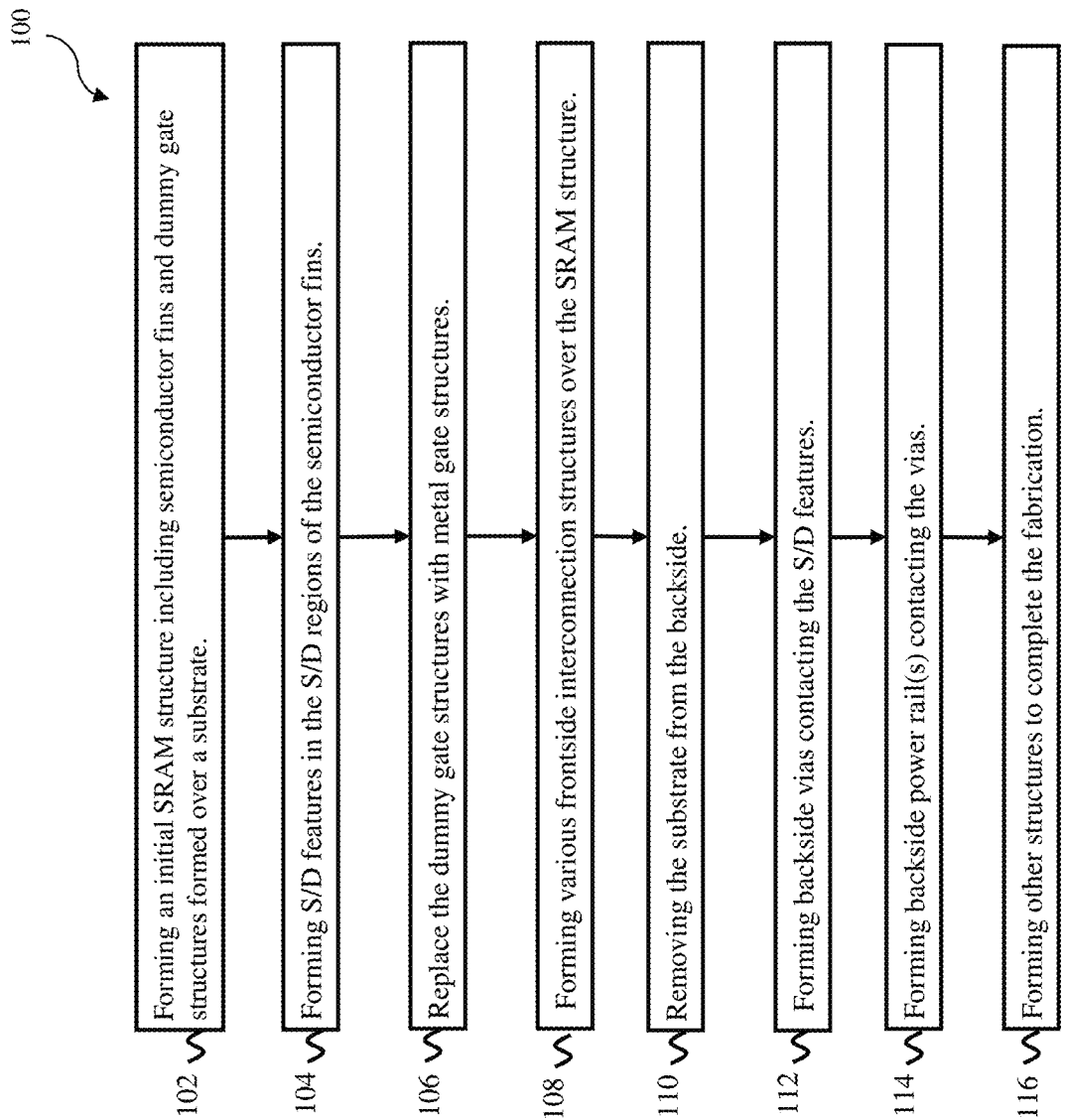
FIG. 2 illustrates a flowchart of an example method 100 for making an example SRAM structure in accordance with some embodiments of the present disclosure.
Figure 3:
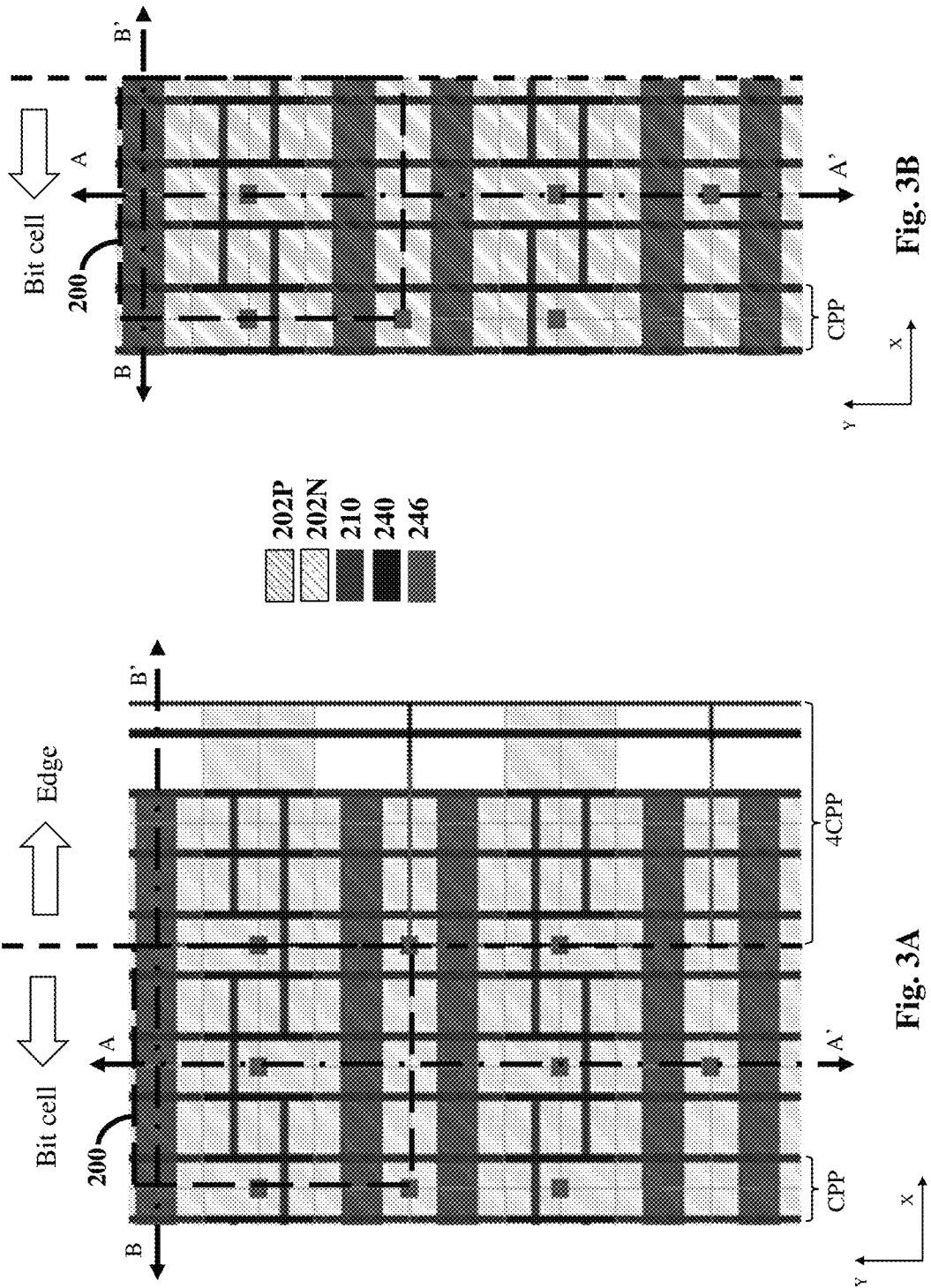
FIGS. 3A and 3B illustrate top views of example SRAM structures in accordance with some embodiments of the present disclosure.
Figure 4:
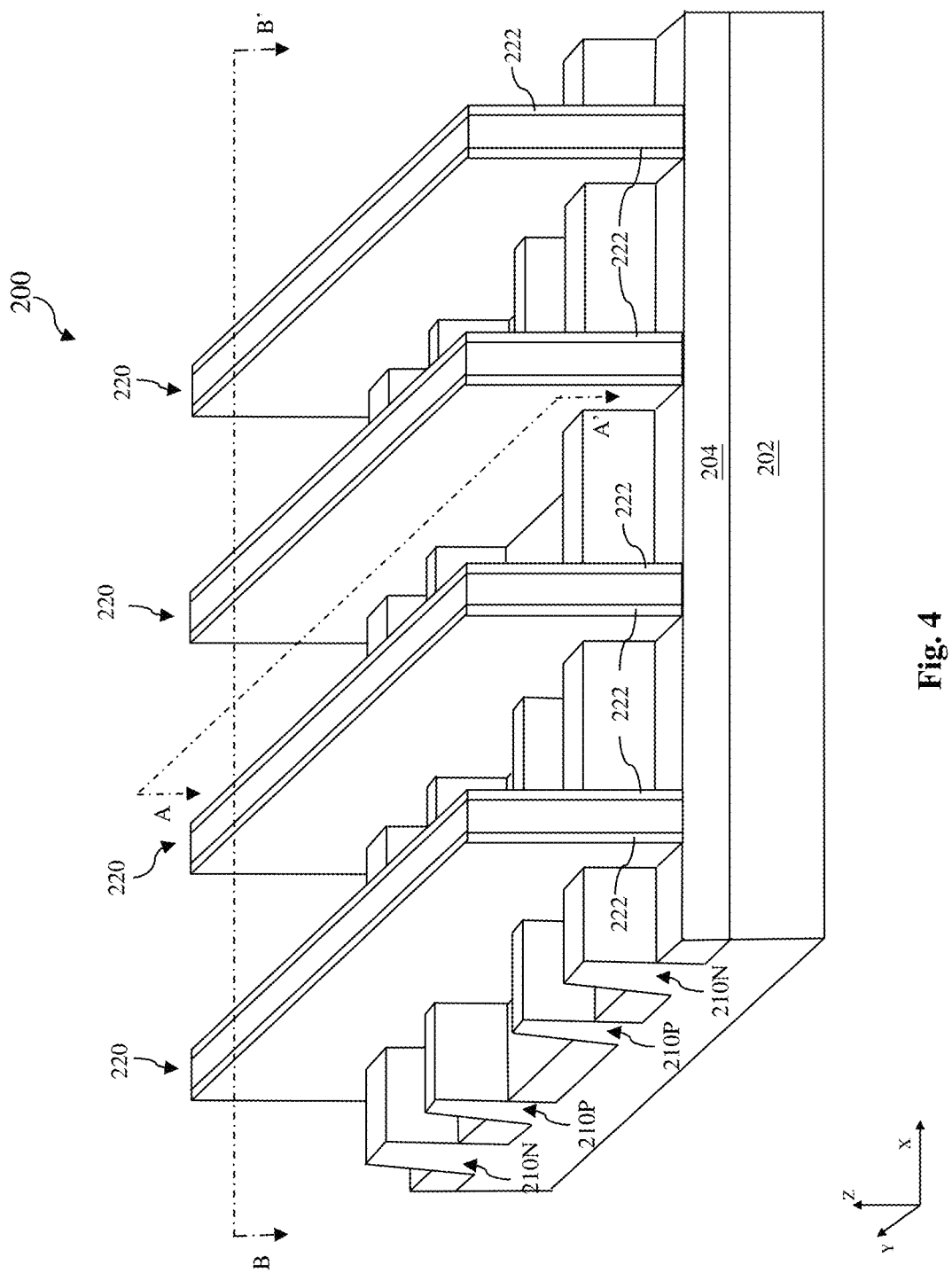
FIG. 4 illustrates a three-dimensional (3D) perspective view of a portion (block 200 in FIG. 3A or 3B) in the bit cell region of the example SRAM structure in accordance with some embodiments of the present disclosure.

FIG. 2 shows a flow chart of a method 100 for making an example SRAM structure in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. The method is described below in conjunction with other figures, which illustrate various three-dimensional and cross-sectional views of the SRAM structure during intermediate steps of the methods. In particular, FIGS. 3A and 3B illustrate top views (that is, in an X-Y plane) of example SRAM structures in accordance with some embodiments of the present disclosure. FIG. 4 illustrates a three-dimensional view of an initial structure of the SRAM portion 200 in FIG. 3A or FIG. 3B (hereinafter the SRAM 200) in accordance with some embodiments of the present disclosure. FIGS. 5A-15A illustrate cross-sectional views of the SRAM 200 along line A-A' (that is, in a Y-Z plane) at intermediate stages of the example method 100 in accordance with some embodiments of the present disclosure. FIGS. 5B-15B illustrate cross-sectional views of the SRAM 200 along line B-B' (that is, in an X-Z plane) at intermediate stages of the example method 100 in accordance with some embodiments of the present disclosure.

The example SRAM may be an intermediate device fabricated during processing of an integrated circuit (IC), or a portion thereof, that may include passive components such as resistors, capacitors, and inductors, and active components such as P-type FETs (PFETs), N-type FETs (NFETs), metal-oxide semiconductor field effect transistors (MOSFET), complementary metal-oxide semiconductor (CMOS) transistors, bipolar transistors, high voltage transistors, high frequency transistors, and/or other memory cells. Although the example SRAM structure in the present disclosure includes only FinFETs, it is understood that the present disclosure can also be applied to an SRAM structure including a nanostructure transistor (also called as a nanosheet device, a nanowire device, a nanoring device, a gate-surrounding device, a gate-all-around (GAA) device, or a multi-bridge-channel (MBC) device). The present disclosure is not limited to any particular number of devices or device regions, or to any particular device configurations.

In some SRAM structures, the edge region includes tap cells has a width as large as 10 CPP, wherein CPP is the critical poly pitch which is defined as the pitch distance between adjacent gate structures. However, in the present disclosure, the tap cell is not necessary in the edge region, and the geometry size of the edge region is reduced to 4 CPP or less. In some embodiments, as illustrated in FIG. 3A, the example SRAM includes a bit cell region and a reduce-sized edge region without tap cells. The edge region has a width (in the X-direction) of 4 CPP. In some other embodiments, as illustrated in FIG. 3B, the example SRAM only includes a bit cell region and the edge region is omitted. The size reduction of the SRAM structure is achieved by backside connecting the Vss and Vdd to the S/D features in the bit cell region. Details about the fabrication process is described below.

Referring to FIGS. 2, 4, 5A, and 5B, at operation 102, a start structure of the SRAM 200 is formed. The start structure of the SRAM 200 includes a substrate 202. In some embodiments, the substrate 202 is a bulk silicon (Si) substrate. Alternatively or additionally, the substrate 202 includes another single crystalline semiconductor, such as germanium (Ge); a compound semiconductor; an alloy semiconductor; or combinations thereof. In some embodiments, the substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrate can be fabricated using separation by implantation of oxygen (SIMOX), wafer bonding, and/or other suitable methods.

Figures 5A, 5B:
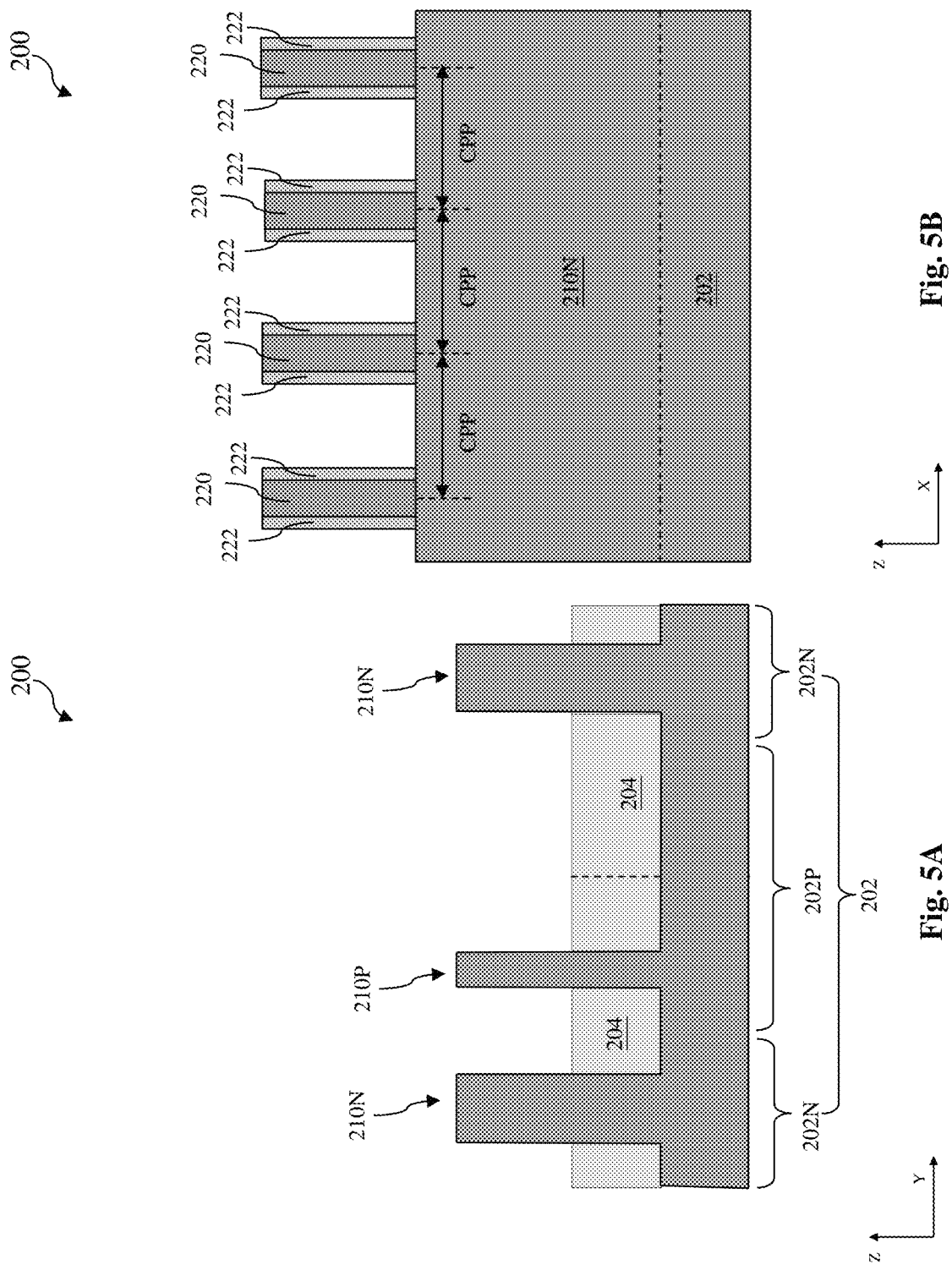

Referring to FIG. 5A, the substrate 202 includes various doped regions configured according to the design requirements of the SRAM 200. In some embodiments, the substrate 202 includes regions 202N for N-type FET doped with P-type dopants (i.e. P-type wells). In some embodiments, the P-type dopants include boron (for example, $BF_2$), indium, other P-type dopant, or combinations thereof. The substrate 202 also includes regions 202P for P-type FET doped with N-type dopants (i.e. N-type wells). In some embodiments, the N-type dopants include phosphorus, arsenic, other N-type dopant, or combinations thereof. The various doped regions can be formed directly on and/or in substrate 202 by various implant process. Still referring to FIG. 5A, the substrate 202 can be defined with a back portion 202B and a front portion 202F. In the later fabrication processes, the S/D features formed in the back portion 202B are backside connected to the supply voltage Vdd and Vss, and the S/D features formed in the front portion 202F is frontside connected to the drain voltage VD.

The SRAM 200 also includes an isolation structure 204 disposed over the substrate 202. The isolation structure 204 electrically isolates active device regions and/or passive device regions of the SRAM 200. The isolation structure 204 can be configured as different structures, such as a shallow trench isolation (STI) structure, a deep trench isolation (DTI) structure, a local oxidation of silicon (LOCOS) structure, or combinations thereof. The isolation structure 204 includes an isolation material, such as silicon oxide (SiO), silicon nitride (SiN), silicon oxynitride (SiON), other suitable isolation material (for example, including silicon, oxygen, nitrogen, carbon, and/or other suitable isolation constituent), or combinations thereof.

SRAM 200 further includes semiconductor fins 210P and 210N (both referred to as fins 210) protruding from the substrate 202. In some embodiments, a semiconductor fin 210P may be subject to a fin cut process to be divided into a plurality of segments. For example, line A-A' cuts through fin cut region where a portion of a semiconductor fin 210P is removed to isolate two segments of the semiconductor fin 210P. The lower portions of the fins 210 are separated by the isolation structure 204. Each fin 210 may be suitable for providing an N-type FET or a P-type FET. In the present disclosure, the fins 210P in the regions 202P are for P-type FET, and the fins 210N in the regions 202N are for N-type FET. The fins 210 are oriented substantially parallel to one another. Each of the fins 210 has at least one channel region, at least one source region, and at least one drain region defined along their length in the X-direction. In some embodiments, the fins 210 are a portion of the substrate 202 (such as a portion of a material layer of substrate 202). For example, in the depicted embodiment, where the substrate 202 includes silicon, the fins 210 include silicon. Alternatively, in some embodiments, the fins 210 are defined in a material layer, such as one or more semiconductor material layers, overlying the substrate 202. For example, the fins 210 can include a semiconductor layer stack having various semiconductor layers (such as a heterostructure) disposed over the substrate 202. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on the design requirements of the SRAM 200. The fins 210 are formed by any suitable process including various deposition, photolithography, and/or etching processes. In some embodiments, the fins 210 can be formed by a double-patterning lithography (DPL) process. It is understood that multiple parallel fins 210 may be formed in a similar manner.

Still referring to FIGS. 4, 5A, and 5B, the SRAM 200 also includes dummy gate structures 220 formed over the fins 210. The dummy gate structure 220 serves as a placeholder for subsequently forming a metal gate structure. In some embodiments, the dummy gate structure 220 extends along the Y-direction and traverse respective fins 210. The dummy gate structure 220 covers the channel regions of the fins 210 which interpose the source regions and the drain regions (both referred to as the S/D regions). The dummy gate structure 220 may include various dummy gate layers, such as an interfacial layer (for example, including SiO) over the channel region of the fins 210, a dummy gate electrode (for example, including polysilicon) over the interfacial layer, and one or more hard mask layers (for example, including SiO and/or SiN) over the dummy gate electrode, and/or other suitable layers. In some embodiments, the dummy gate layer materials are deposited (for example, by chemical vapor deposition (CVD), physical vapor deposition (PVD), atomic layer deposition (ALD), and/or other suitable deposition process) over the fins 210. A lithography process is then performed to form a mask covering the channel regions of the fins 210. Thereafter, the different dummy gate layers are etched using the lithography mask to form the dummy gate structures 220. The lithography mask is then removed using any proper method. As illustrated in FIG. 5B, the pitch distance between the adjacent dummy gate structures 220 is referred to as the CPP which is decided by the design requirements of the SRAM structure.

Still at operation 102, gate spacers 222 are formed along sidewalls of the dummy gate structures 220. The gate spacers 222 may include various layers, for example, one or more dielectric layers and pattern layers. In some embodiments, the gate spacer 222 may include any suitable dielectric material, such as silicon, oxygen, carbon, nitrogen, other suitable material, or combinations thereof (for example, SiO, SiN, SiON, or silicon carbide (SiC)). The gate spacers 222 may be formed by various suitable methods, such as various deposition processes (for example, ALD, CVD, PVD, other suitable methods, or combinations thereof), various photolithography processes, and/or various etching processes (for example, dry etching, wet etching, or a combination thereof).

Referring to FIGS. 2, 6A, 6B, 7A, and 7B, at operation 104, source/drain (S/D) features 230N, 230P and 230P' (all referred to as the S/D features 230) are formed over the S/D regions of the fins 210. Referring to FIGS. 6A and 6B, first, the S/D regions of the fins 210 are recessed along the sidewalls of the gate spacers 222 to form the S/D trenches 224. In some embodiments, the S/D regions of the stack 210 are recessed by S/D etching process(es), which can be a dry etch (such as a reactive ion etching (RIE) process), a wet etch, or combinations thereof.

Figure 7B:
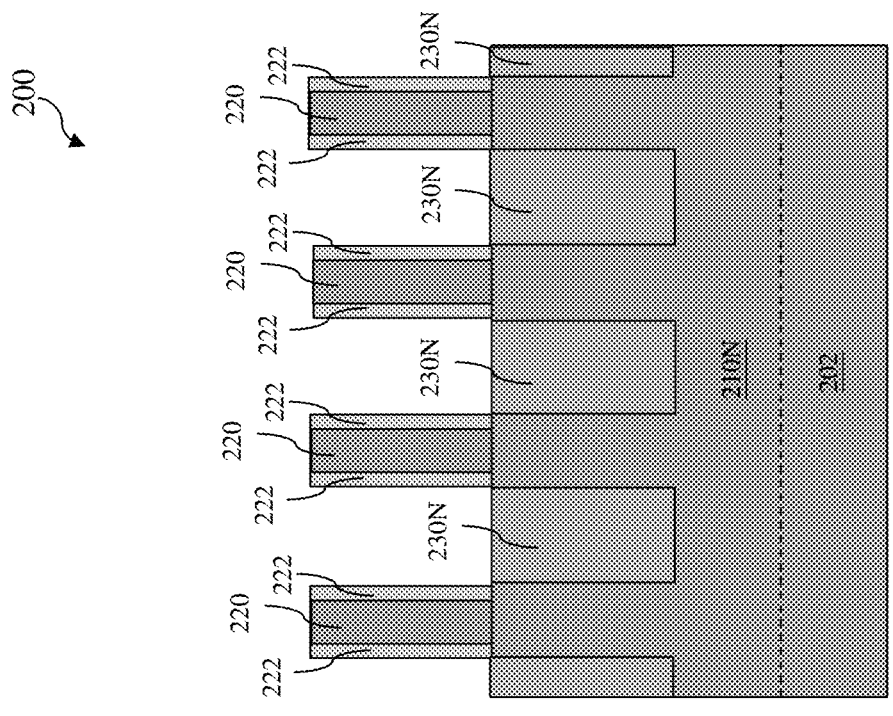
Figure 7A:
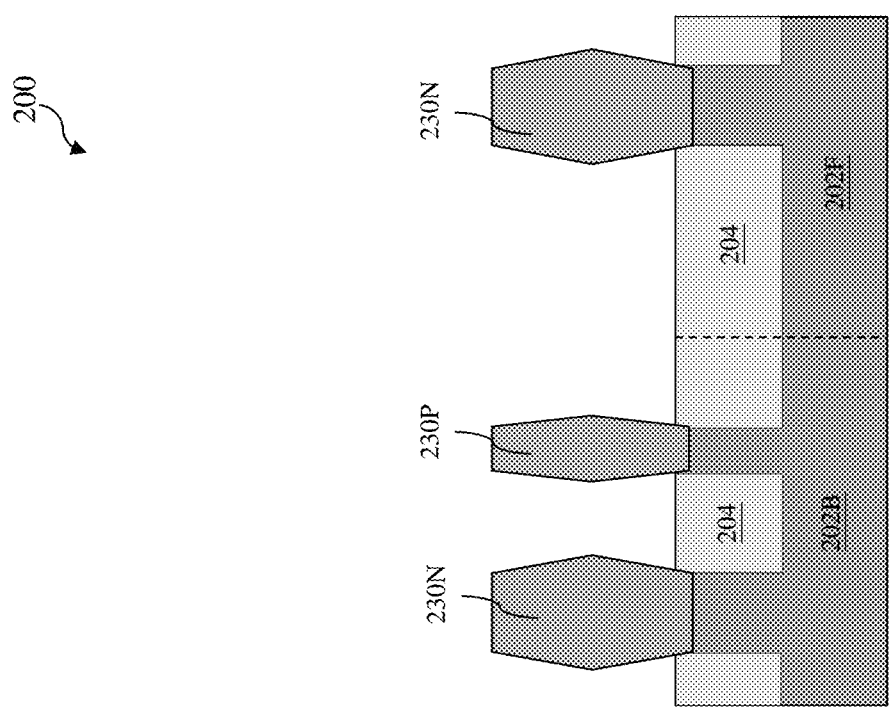

Thereafter, referring to FIGS. 7A and 7B, epitaxial S/D features 230 are formed in the S/D trenches 224. In some embodiments, the N-type S/D features 230N include silicon and can be doped with carbon, phosphorous, arsenic, other N-type dopant, or combinations thereof (for example, forming Si:C epitaxial S/D features, Si:P epitaxial S/D features, or Si:C:P epitaxial S/D features). In some embodiments, the P-type S/D features 230P and 230P' include silicon germanium or germanium and can be doped with boron, other P-type dopant, or combinations thereof (for example, forming Si:Ge:B epitaxial S/D features). An epitaxy process may be implemented to epitaxially grow the S/D features 230 from the fins 210 in the S/D trenches 224. The epitaxy process includes CVD deposition (for example, vapor-phase epitaxy (VPE), ultra-high vacuum CVD (UHV-CVD), LPCVD, and/or PECVD), molecular beam epitaxy, other suitable SEG processes, or combinations thereof. In some embodiments, the epitaxial S/D features 230 may include multiple epitaxial semiconductor layers, and different epitaxial semiconductor layers are different in amount of dopant comprised therein.

Figures 8A, 8B:
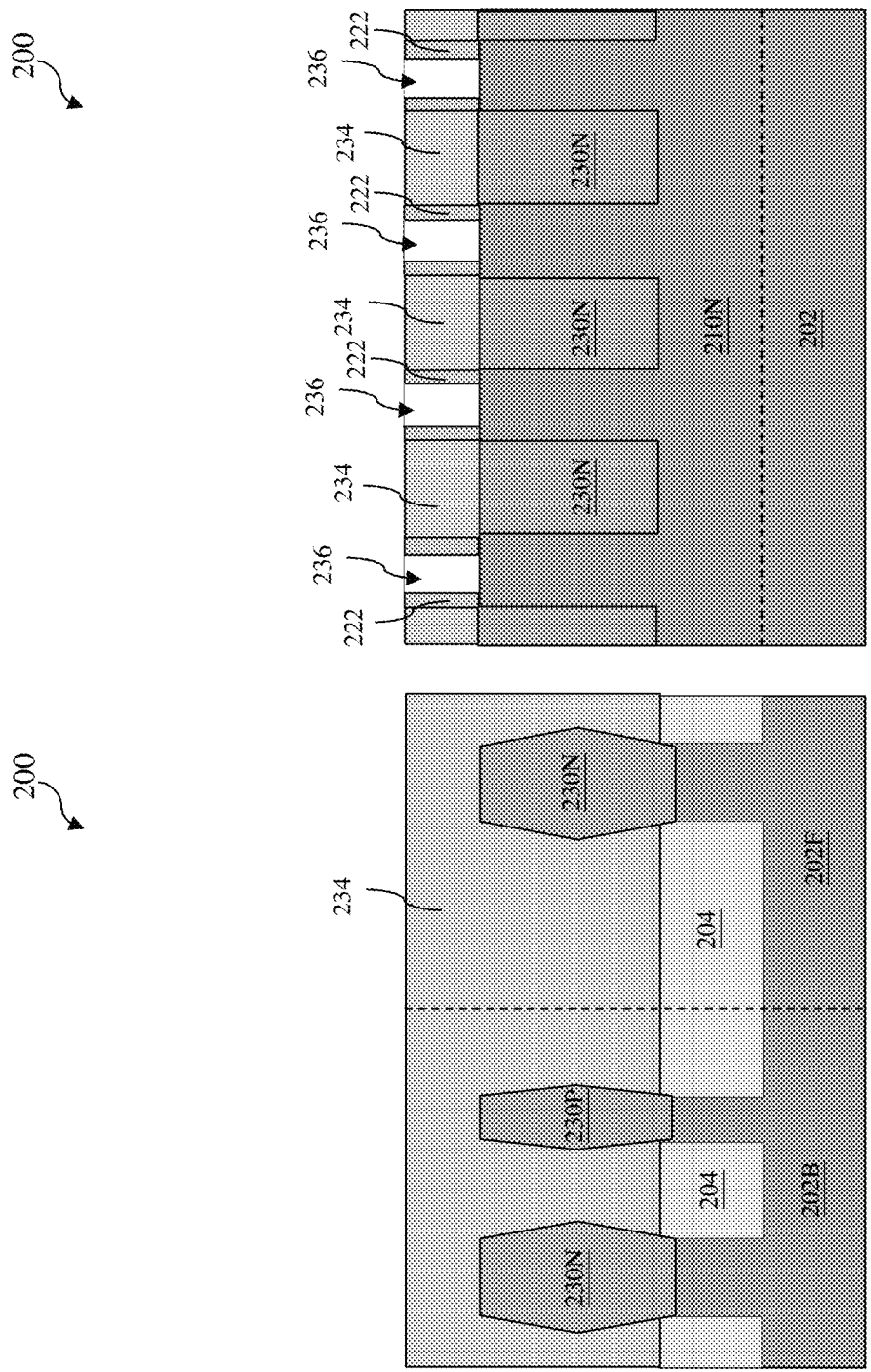

Referring to FIGS. 2, 8A, 8B, 9A, and 9B, at operation 106, a gate replacement process if performed, such that the dummy gate structures 220 are replace by metal gate structures 240. Referring to FIGS. 8A and 8B, an interlayer dielectric (ILD) layer 234 is disposed over the S/D features 230 and between the adjacent dummy gate structures 220 and gate spacers 222. In some embodiments, the ILD layer 234 includes a dielectric material including, for example, SiO, SiN, SiON, tetraethylorthosilicate (TEOS) formed oxide, phosphosilicate glass (PSG), borophosphosilicate glass (BPSG), low-k dielectric material (K<3.9), other suitable dielectric material, or combinations thereof. The ILD layer 234 may be formed by a deposition process (such as CVD, PVD, ALD, plating, other suitable methods, or combinations thereof). In some embodiments, a CMP process and/or other planarization process can be performed until reaching (exposing) the dummy gate electrodes of the dummy gate structures 220.

Thereafter, the dummy gate structures 220 are removed to form gate trenches 236 exposing the channel regions of the fins 210. In some embodiments, removing the dummy gate structures 220 includes one or more etching processes, such as wet etching, dry etching, or a combination thereof.

Figures 9A, 9B:
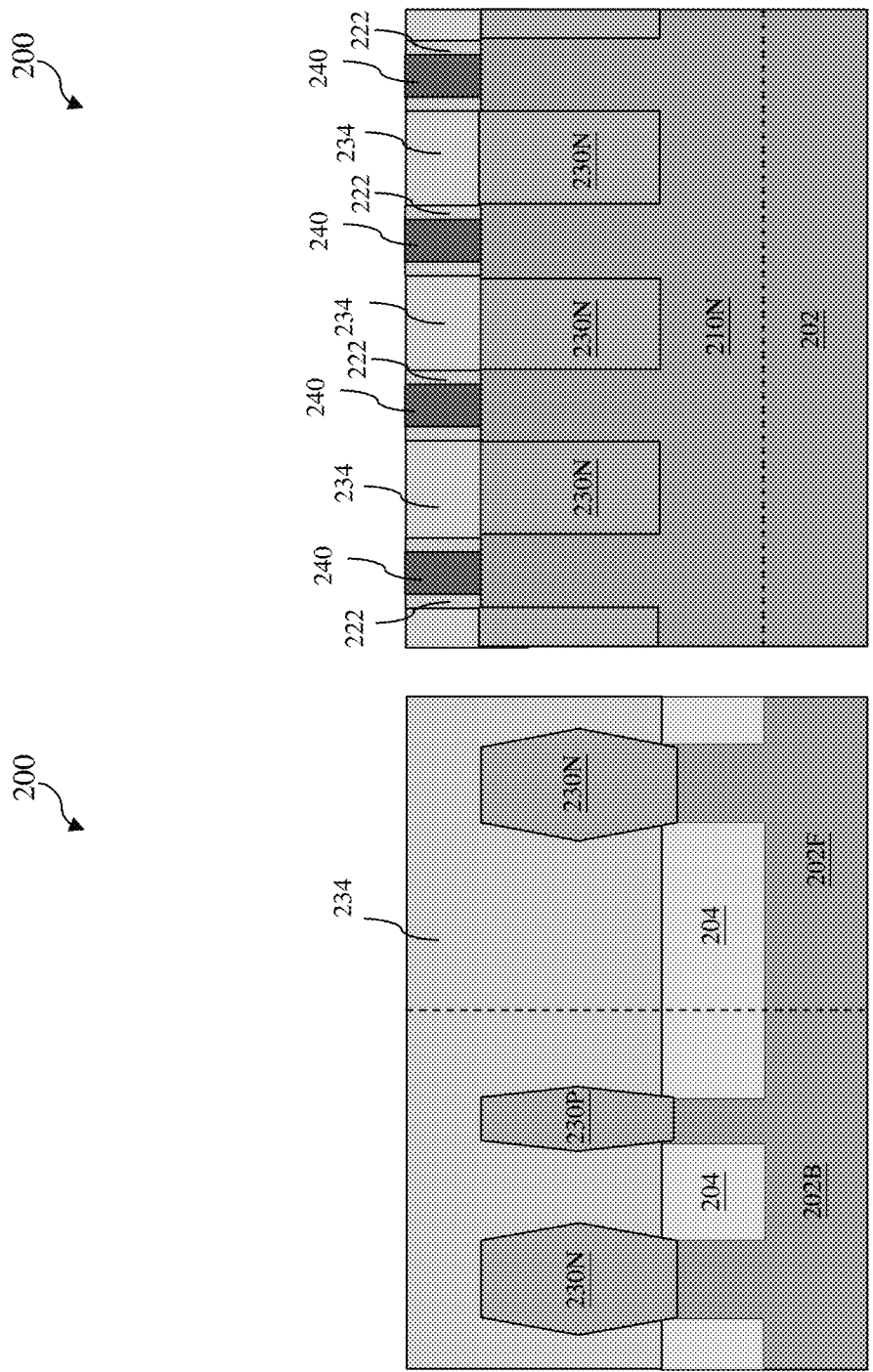

Then, referring to FIGS. 9A and 9B, still at operation 106, metal gate structures 240 are formed in the gate trenches 236 over the channel regions of the fins 210. In some embodiments, each metal gate structure 240 includes a gate dielectric layer, a metal gate electrode, a hard mask layer, and/or other metal gate layers. In some embodiments, the gate dielectric layer includes an oxide with nitrogen doped dielectric material combined with metal content high-K dielectric material. In some embodiments, the material of the gate dielectric layer is selected from tantalum oxide ($Ta_2O_5$), aluminum oxide ($Al_2O_3$), hafnium (Hf) content oxide, tantalum (Ta) content oxide, titanium (Ti) content oxide, zirconium (Zr) content oxide, aluminum (Al) content oxide, lanthanum (La) content oxide, high K material (K>=9), other suitable high-k dielectric material, or combinations thereof. In some embodiments, the gate dielectric layer is deposited by CVD, PVD, ALD, and/or other suitable method. The metal gate electrode is then formed over the gate dielectric layer. Each metal gate electrode includes one or more work function metal (WFM) layers and a bulk metal. The WFM layer is configured to tune a work function of its corresponding transistor to achieve a desired threshold voltage Vt. And, the bulk metal is configured to serve as the main conductive portion of the functional gate structure. In some embodiments, the P-type WFM layer material includes TiN, TaN, TaSN, Ru, Mo, Al, WN, WCN $ZrSi_2$, $MoSi_2$, $TaSi_2$, $NiSi_2$, other P-type work function material, or combinations thereof; the N-type WFM layer material includes Ti, Al, Ag, Mn, Zr, TiAl, TiAlC, TiAlSiC, TaC, TaCN, Tasilicon nitride, TaAl, TaAlC, TaSiAlC, TiAlN, other N-type work function material, or combinations thereof. The bulk metal may include Al, W, Cu, or combinations thereof. The various layers of the metal gate electrode may be formed by any suitable method, such as CVD, ALD, PVD, plating, chemical oxidation, thermal oxidation, other suitable methods, or combinations thereof. Thereafter, a gate hard mask layer is formed over the top of the metal gate electrode. The gate hard mask layer can serve as a contact etch protection layer. In some embodiments, the gate hard mask layer includes dielectric materials such as oxide based dielectric, nitride based dielectric (e.g. silicon oxycarbide (SiOC), silicon oxynitride (SiON), silicon oxy-carbonitride (SiOCN)), metal oxide dielectric (e.g. hafnium oxide ($HfO_2$), tantalum oxide ($Ta_2O_5$), titanium oxide ($TiO_2$), zirconium oxide ($ZrO_2$), aluminum oxide ($Al_2O_3$), yttrium oxide ($Y_2O_3$)), or a combinations thereof. Formation of the gate hard mask layer may include various steps. For example, metal gate etching back, hard mask layer deposition, planarization process, and etc. Thereafter, one or more polishing processes (for example, CMP) are applied to remove any excess conductive materials and planarize the top surface of the SRAM 200.

Figures 10A, 10B:
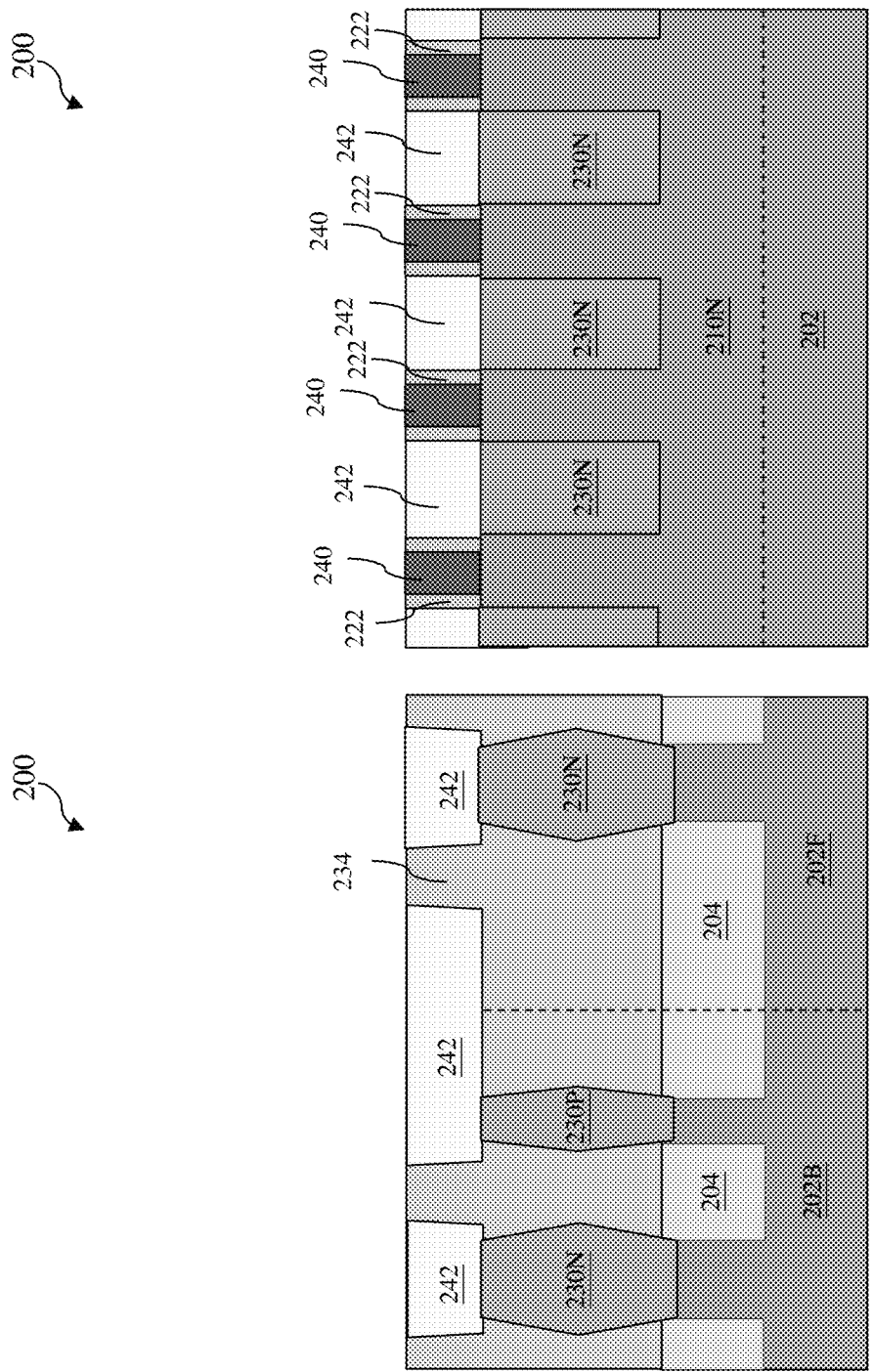

Now, referring to FIGS. 2, 10A and 10B, 11A, and 11B, at operation 108, various frontside interconnection structures are formed over the SRAM 200. Referring to FIGS. 10A and 10B, S/D contacts 242 are formed over the epitaxial S/D features 230. The S/D contacts 242 includes conductive materials such as Al, W, Cu, or combinations thereof. A silicide layer (for example include nickel silicide, cobalt silicide, tungsten silicide, tantalum silicide, titanium silicide, platinum silicide, erbium silicide, palladium silicide, or combinations thereof) may be formed between the epitaxial S/D features 230 and the S/D contacts 242. Formation of the S/D contacts 242 and the silicide layers may involve multiple lithography, etching, deposition, annealing, and planarization processes. In some embodiments, the S/D contacts 242 are formed by a self-aligned contact forming process.

Figures 11A, 11B:
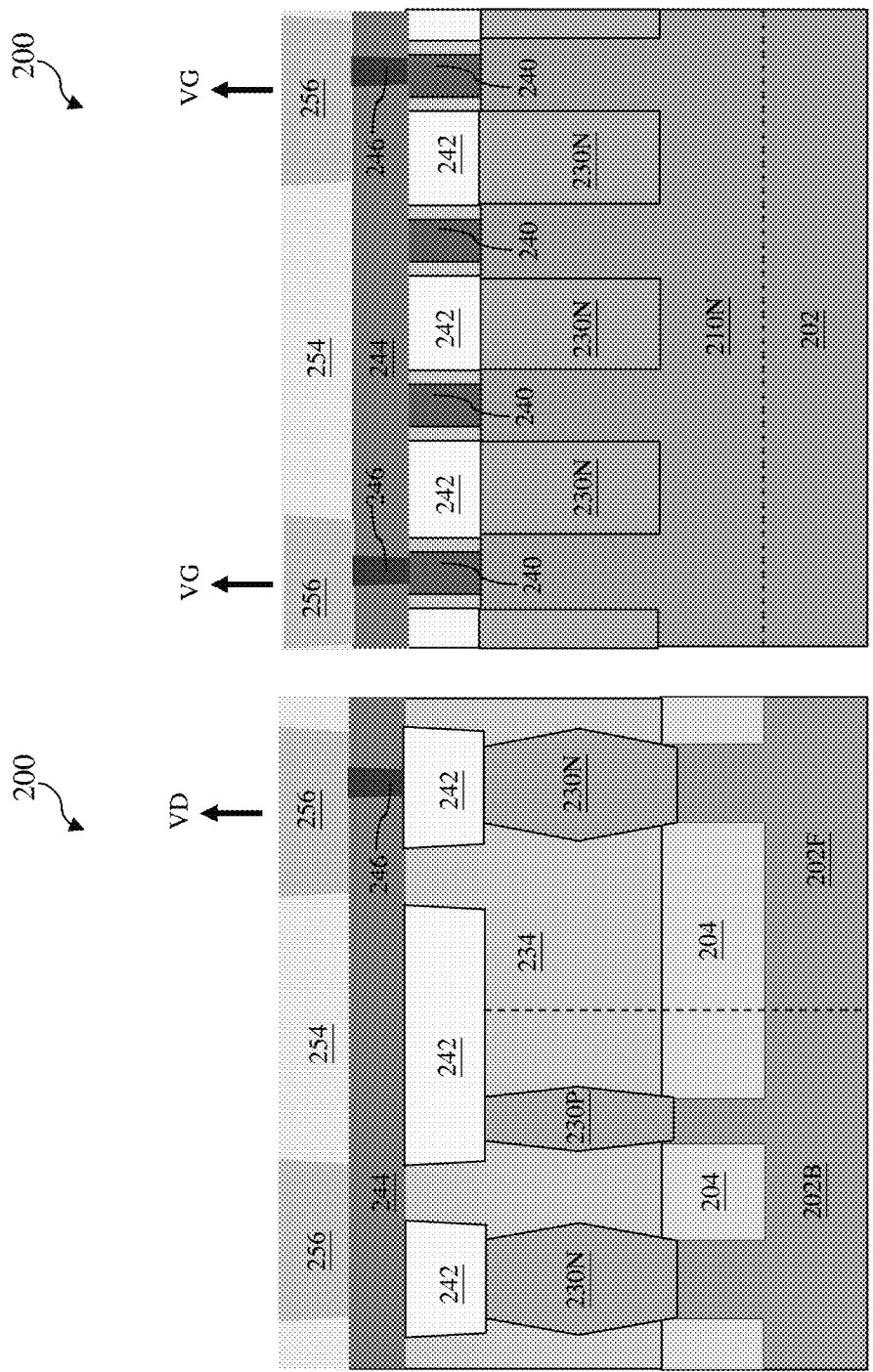

Then referring to FIGS. 11A and 11B, various other frontside interconnection structures are formed over the top of the SRAM 200. In some embodiments, the various interconnection structures include multiple dielectric ILD layers 244 and 254, frontside vias 246, frontside metal lines 256, and/or other structures, configured to connect the various features to form a functional SRAM cell. For example, first, an ILD layer 244 is deposited over the top of the SRAM 200. The ILD layer 244 includes dielectric materials similar as that of the ILD layer 234. A photoresist mask is then formed, by a lithography process, over the ILD layer 244 to expose the positions of the frontside vias 246. The portion of the ILD layer 244 exposed from the photoresist mask is removed by an etching process, and the removed portion is then filled (for example, by a deposition process) by the conductive material of the vias 246. Similar deposition, lithography, and etching processes are performed to form the ILD layer 254 and the frontside metal lines 256. As depicted in FIG. 11A, the S/D feature 230N over the substrate front portion 202F is connected to the drain voltage VD through the frontside via and frontside metal line. Some of the metal gate structures 240 are connected to the gate voltage VG through the frontside vias and frontside metal lines, according to the design requirements of the SRAM 200. The S/D features 230P and 230N over the substrate back portion 202B are not connected to any voltage from the frontside.

Thereafter, backside fabrication processes are performed to connecting the S/D features 230N and 230P in the substrate back portion 202B to the negative supply voltage Vss and the positive supply voltage Vdd, respectively. The backside processes may be performed by turning the wafer upside-down.

Figures 12A, 12B:
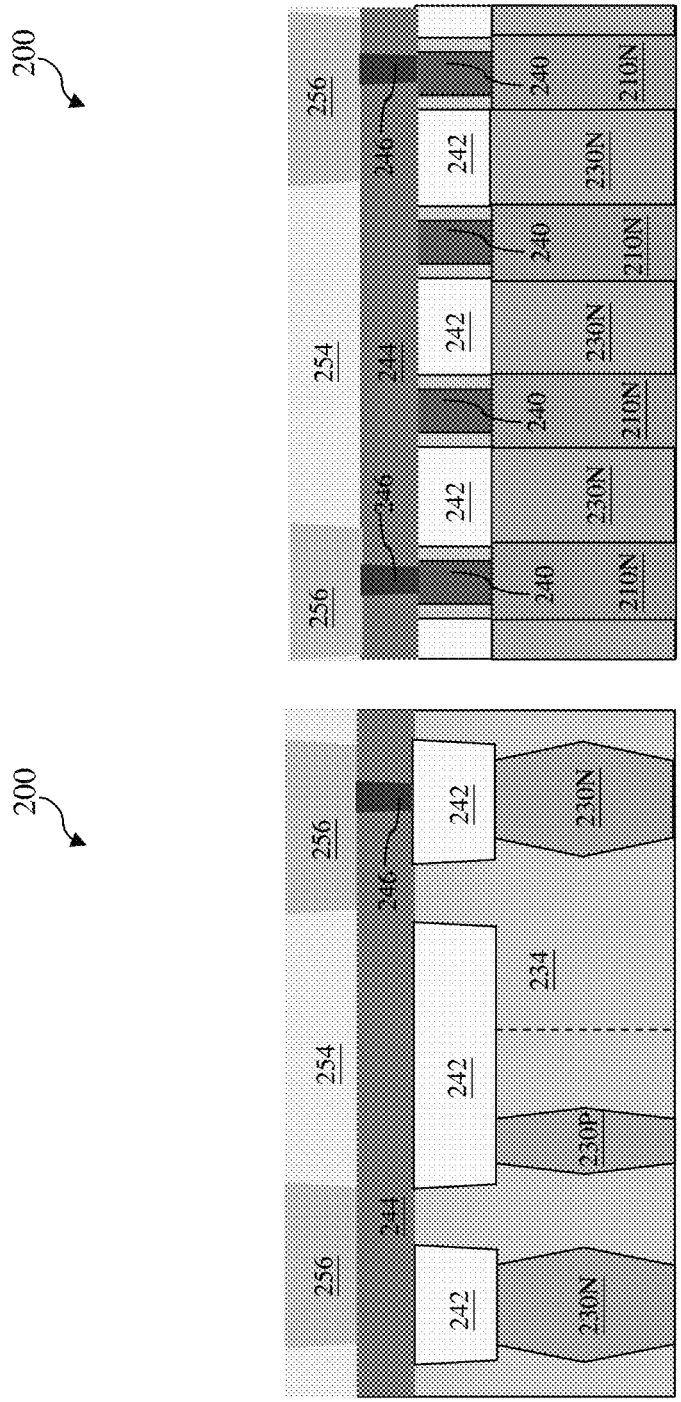

Referring to FIGS. 2, 12A, and 12B, at operation 110, the substrate 202 is removed from the backside of the SRAM 200. Removing of the substrate 202 may include various steps such as a planarization process (for example, CMP) and/or an etching process (for example, wet etching, dry etching, or combinations thereof). In some embodiments, the substrate 202 may be planarized until adjacent semiconductor fin structures are no longer jointed by the substrate 202 or a portion thereof. After removing the substrate 202, the bottom surfaces of the S/D features 230 are exposed from the backside.

According to the present disclosure, the removal of the substrate 202 also remove the n-type wells and the p-type wells below the channel regions, source regions and drain regions, thereby eliminating the P-N junctions and leakage paths. Due to the lack of P-N junctions, the very purpose of having tap cells in the first place is eliminated. This allows the tap cells to be completely removed from the edge portions. The SRAM structure of the present disclosure therefore may include edge portions that are free of tap cells. Being free of tap cells, the edge portions according to the present disclosure may have a smaller width. As a comparison, an edge portion with tap cells may have a width of about 10 CPP or more and a tap-cell-free edge portion may have a width of about 4 CPP or less. It can be seen that by eliminating the tap cells, the SRAM structure of the present disclosure may have a smaller foot print. In other words, the tap-cell-free SRAM structure of the present disclosure is more compact.

Figures 13A, 13B:
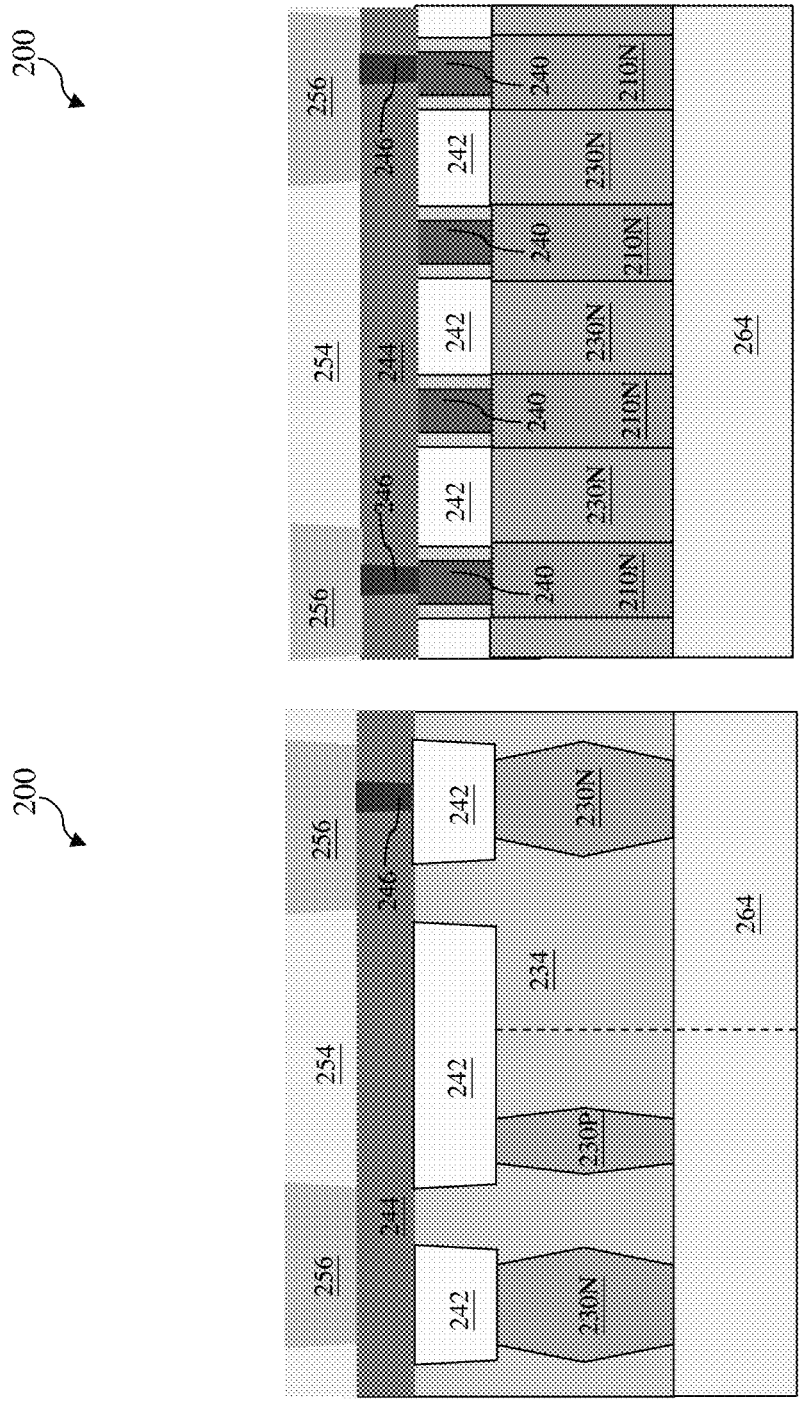

Referring to FIGS. 2, 13A, 13B, 14A and 14B, at operation 112, backside vias 266 are formed connecting the bottom surfaces of the S/D features 230 in the substrate back portion. Referring to FIGS. 13A and 13B, a backside ILD layer 264 is deposited covering the bottom surfaces of the S/D features 230. The backside ILD layer 264 includes a material similar as those of the ILD layers 234, 244, and 254. In some embodiments, the backside ILD layer 264 may be formed by a deposition process (such as CVD, PVD, ALD), plating, other suitable methods, or combinations thereof. Compared to some structures, the semiconductor fins are now disposed on the backside ILD layer 264 and are electrically isolated from one another.

Figures 14A, 14B:
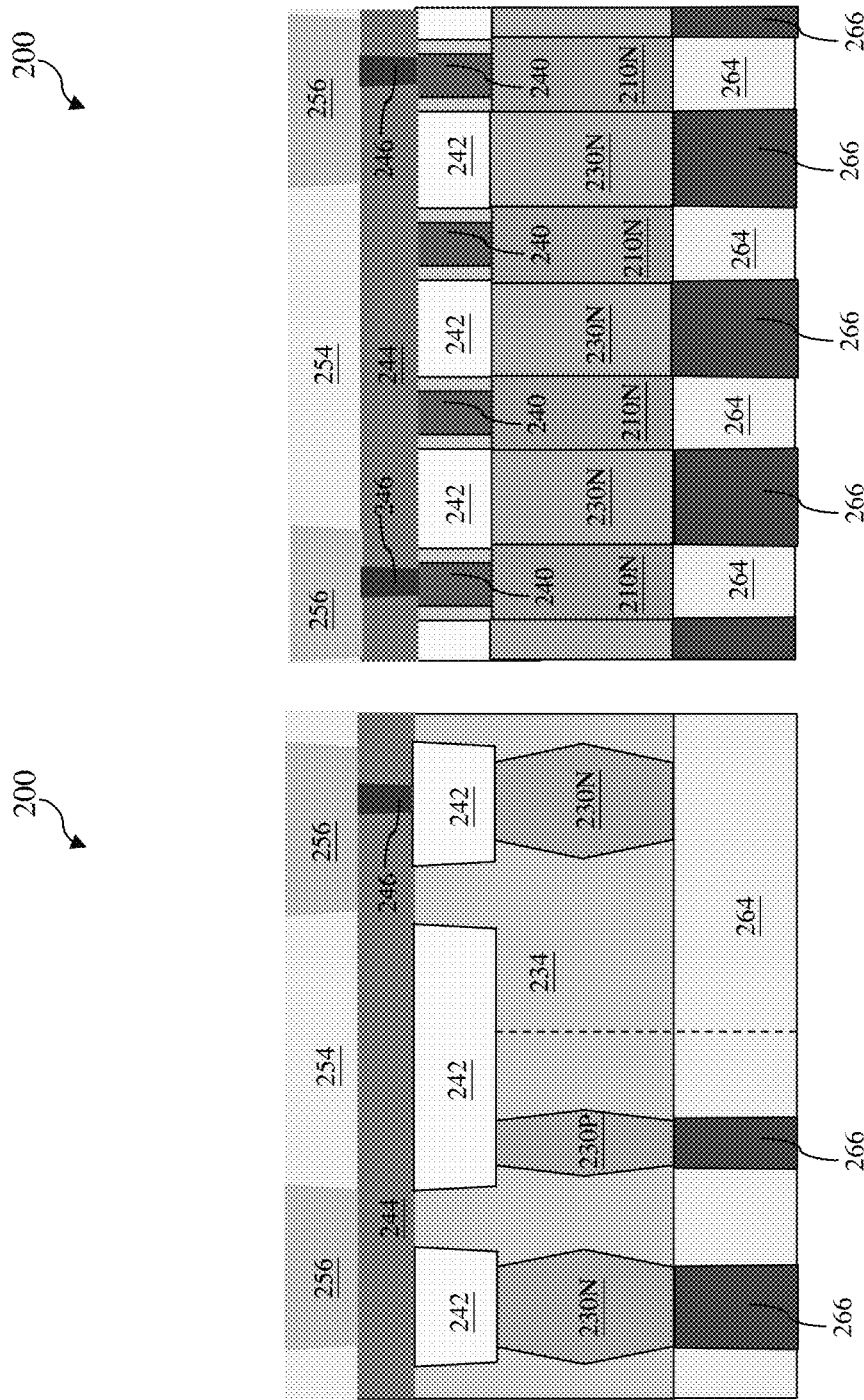

Referring to FIGS. 14A and 14B, the backside vias 266 are formed in the backside ILD layer 264 and connect the bottom surfaces of the S/D features 230 in the substrate back portion. The backside vias 266 include a conductive material and may be formed by a lithography process, a deposition process, and/or other proper processes. In some embodiments, a silicide layer (for example include nickel silicide, cobalt silicide, tungsten silicide, tantalum silicide, titanium silicide, platinum silicide, erbium silicide, palladium silicide, or combinations thereof) may be formed between the epitaxial S/D features 230 (including the epitaxial S/D features 230N and 230P in the back region) and the backside vias 266.

Figures 15A, 15B:
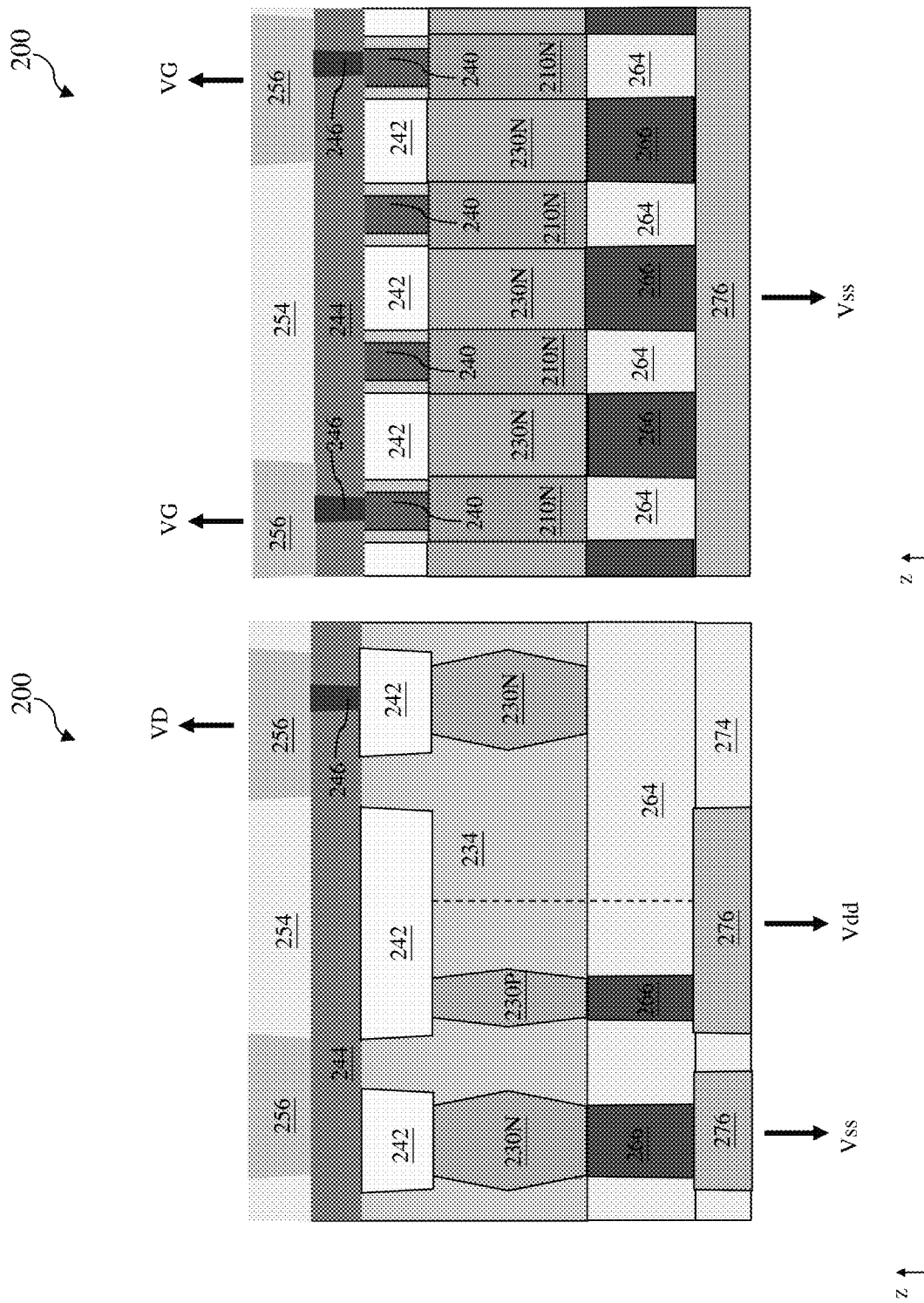

Referring to FIGS. 2, 15A, and 15B, at operation 114, backside power rails 276 are formed in another backside ILD layer 274 to connect to the backside vias 266. The materials and the fabrication processes of the backside ILD layer 274 and the backside power rails 276 are similar as the materials and the fabrication processes of the backside ILD layer 264 and the backside vias 266.

Thereafter, at operation 116, other backside interconnective structures are formed, such that the S/D features 230N and 230P in the back portion of the substrate can be connected to the negative supply voltage Vss and the positive supply voltage Vdd, respectively.

Structures of the SRAM 200 may be applied to an SRAM bit cell 300 illustrated in FIG. 16 to reduce its dimensions. As shown in FIG. 16, the SRAM bit cell 300 include a bit cell portion 302 and two symmetrical edge portions 304 sandwiching the bit cell portion 302 along the X direction. Depending on the design requirements, the bit cell portion 302 may have a length C between about 16 CPPs and about 512 CPPs. Each of the edge portions 304 may have an edge dimension E, which may be between 0 CPP and 4 CPPs. In alternative SRAM bit cell that includes tap cells, tap cell portion 306 is needed on either end of the SRAM bit cell 300. Each of the tap cell portions 306 has a tap cell edge dimension T, which may be about 6 CPPs. When the SRAM bit cell 300 includes tap cells, it may have a first cell length L1, which is the sum of the length C and two times of the edge dimensions E. When the SRAM bit cell 300 is free of tap cells, it may have a second cell length L2, which is the sum of the length C, two times of the edge dimensions E, and two times of the tap cell edge dimensions T. Depending on the length C of the bit cell portion 302, the second cell length L2 may be between about 98% and about 66% of the first cell length L1. In other words, by eliminating the tap cells, the cell length along the X direction may be reduced by between about 2% and about 34%. This reduction percentage may be substantially similar when the SRAM bit cell 300 is based on 6-transistor (6T), 7-transistor (7T), 8-transistor (8T), 9-transistor (9T), 10-transistor (10T), 11-transistor (11T), or 12-transistor (12T) technologies. It is noted that FIGS. 3A and 3B illustrate only one edge while FIG. 16 illustrates two edges.

Although not intended to be limiting, one or more embodiments of the present disclosure provide many benefits to an SRAM structure and a formation process thereof. For example, embodiments of the present disclosure provide an SRAM structure including S/D features in the bit cell regions connecting to the supply voltages and drain voltage, respectively, via backside contact structures. Because the substrate, along with n-type wells regions and p-type well regions, are removed during the formation of backside contact structures, no tap cells are needed to provide reverse biases. Therefore, the edge portion of the SRAM structure may be free of tap cells. The width of the edge portion can be reduced from 10 CPP to 4 CPP or less. Thus, the geometry size and the fabrication cost of the SRAM structure can be reduced.

The present disclosure provides for many different embodiments. A static random-access memory (SRAM) device without tap cell and methods of fabrication thereof are disclosed herein. An exemplary semiconductor device includes a first source/drain (S/D) feature and a second S/D feature formed in an interlayer dielectric layer (ILD) of a bit cell region of the SRAM structure, wherein the first S/D feature and the second S/D feature are of a same type, a frontside via electrically connecting to the first S/D feature, and a first backside via electrically connecting to the second S/D feature.

In some embodiments, the SRAM structure may further include a third S/D feature formed in the ILD, wherein the third S/D feature is of a type different than the type of the first and the second S/D features, and a second backside via electrically connecting to the third S/D feature. In some implementations, the first S/D feature electrically connects to the drain voltage (VD), the second S/D feature electrically connects to the negative supply voltage (Vss), and the third S/D feature electrically connects to the positive supply voltage (Vdd). In some instances, the first and second S/D features are N-type S/D features, and the third S/D feature is a P-type S/D feature. In some embodiments, the SRAM structure may further include a S/D contact formed between the first S/D feature and the frontside via. In some embodiments, the SRAM structure may further include semiconductor fins formed along sidewalls of the first and second S/D features, and gate structures formed over the semiconductor fins. In some instances, the SRAM structure may further include an edge region free of a tap cell.

The present disclosure also provides a static random-access memory (SRAM) structure. An SRAM structure according to the present disclosure includes a first source/drain (S/D) feature and a second S/D feature formed in a bit cell region of the SRAM structure, wherein the first S/D feature and the second S/D feature are of different types, a first backside via electrically connecting to the first S/D feature, and a second backside via electrically connecting to the second S/D feature.

In some embodiments, the SRAM structure may further include an edge region free of a tap cell. In some embodiments, a width of the edge region is equal or less than 4 critical poly pitches (CPP). In some implementations, the SRAM structure may further include a third S/D feature formed in the bit cell region of the SRAM structure, wherein the third S/D feature is of the same type as the first S/D feature, a S/D contact formed over the third S/D feature, and a frontside via formed over the S/D contact and electrically connecting to the third S/D feature. In some instances, the first S/D feature and the third S/D feature are N-type S/D features and the second S/D feature is a P-type S/D feature. In some embodiments, the first S/D feature electrically connects to a negative supply voltage (Vss), the second S/D feature electrically connects to a positive supply voltage (Vdd), and the third S/D feature electrically connects to a drain voltage (VD). In some instances, the SRAM structure may further include semiconductor fins formed along sidewalls of the first, second, and third S/D features, and gate structures formed over the semiconductor fins and electrically connecting to a gate voltage (VG).

The present disclosure also provides a method for forming a static random-access memory (SRAM) structure. A method according to the present disclosure includes receiving a substrate including a first region and a second region, forming a first semiconductor fin in the first region of the substrate and a second semiconductor fin in the second region of the substrate, wherein the first semiconductor fin and the second semiconductor fin are separated by an isolation structure, forming a first source/drain (S/D) feature over the first semiconductor fin and a second S/D feature over the second semiconductor fin, connecting the second S/D feature to a frontside conductive feature, and connecting the first S/D feature to a first backside conductive feature.

In some embodiments, the method may further include forming a third semiconductor fin in the first region and a fourth semiconductor fin in the second region, wherein the first semiconductor fin and the second semiconductor fin are of a same type, and the third semiconductor fin and the fourth semiconductor fin are of another same type which is different from the type of the first semiconductor fin and the second semiconductor fin. In some embodiments, the method may further include epitaxially growing a third source/drain (S/D) feature over the third semiconductor fin, and connecting the third S/D feature with a second backside conductive feature. In some implementations, the frontside conductive feature is connected to a drain voltage (VD), the first backside conductive feature is connected to a negative supply voltage (Vss), and the second backside conductive feature is connected to a positive supply voltage. In some embodiments, connecting the second S/D feature to a frontside conductive feature includes forming a S/D contact over the second S/D feature, forming a frontside via contacting the S/D contact, and forming a frontside metal line contacting the frontside via. In some instances, connecting the first S/D feature to a first backside conductive feature includes removing the substrate and the isolation structure, forming a backside via contacting the first S/D feature, and forming a backside power rail contacting the backside via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random-access memory (SRAM) structure comprising:
   a first source/drain (S/D) feature and a second S/D feature formed in an interlayer dielectric layer (ILD) of a bit cell region of the SRAM structure, wherein the first S/D feature and the second S/D feature are of a same type;
   a frontside via electrically connecting to the first S/D feature;
   a first backside via electrically connecting to the second S/D feature; and
   a third S/D feature formed in the ILD, wherein the third S/D feature is of a type different than the type of the first and the second S/D features.

2. The SRAM structure of claim 1, further comprising:
   a second backside via electrically connecting to the third S/D feature.

3. The SRAM structure of claim 2, wherein the first S/D feature electrically connects to a drain voltage (VD), the second S/D feature electrically connects to a negative supply voltage (Vss), and the third S/D feature electrically connects to a positive supply voltage (Vdd).

4. The SRAM structure of claim 2, wherein the first and second S/D features are N-type S/D features, and the third S/D feature is a P-type S/D feature.

5. The SRAM structure of claim 1, further comprising a S/D contact formed between the first S/D feature and the frontside via.

6. The SRAM structure of claim 1, further comprising semiconductor fins formed along sidewalls of the first and second S/D features; and
   gate structures formed over the semiconductor fins.

7. The SRAM structure of claim 1, further comprising an edge region free of a tap cell.

8. A semiconductor structure comprising:
   a first source/drain (S/D) feature and a second S/D feature formed in a cell region of the semiconductor structure, wherein the first S/D feature and the second S/D feature are of different types and disposed over a first dielectric layer;
   a second dielectric layer over the first S/D feature, the second S/D feature, and the first dielectric layer;
   a first backside via extending through the first dielectric layer to electrically connect to the first S/D feature; and
   a second backside via electrically connecting to the second S/D feature,
   wherein the second dielectric layer interfaces and surrounds the first S/D feature and the second S/D feature.

9. The semiconductor structure of claim 8, further comprising an edge region free of a tap cell.

10. The semiconductor structure of claim 9, wherein a width of the edge region is equal or less than 4 critical poly pitches (CPP).

11. The semiconductor structure of claim 8, further comprising:
    a third S/D feature formed in the cell region of the semiconductor structure, wherein the third S/D feature is of the same type as the first S/D feature;
    a S/D contact formed over the third S/D feature; and
    a frontside via formed over the S/D contact and electrically connecting to the third S/D feature.

12. The semiconductor structure of claim 11, wherein the first S/D feature and the third S/D feature are N-type S/D features and the second S/D feature is a P-type S/D feature.

13. The semiconductor structure of claim 12, wherein the first S/D feature electrically connects to a negative supply voltage (Vss), the second S/D feature electrically connects to a positive supply voltage (Vdd), and the third S/D feature electrically connects to a drain voltage (VD).

14. The semiconductor structure claim 11, further comprising:
    semiconductor fins formed along sidewalls of the first, second, and third S/D features; and
    gate structures formed over the semiconductor fins and electrically connecting to a gate voltage (VG).

15. A semiconductor structure, comprising:
    a first dielectric layer;
    a first rail and a second rail disposed in the first dielectric layer and spaced apart from one another;
    a second dielectric layer disposed over the first dielectric layer, the first rail and the second rail;
    a first backside via extending through the second dielectric layer to contact the first rail;
    a second backside via extending through the second dielectric layer to contact the second rail;
    a third dielectric layer disposed over the second dielectric layer;
    a first epitaxial feature disposed in the third dielectric layer and in contact with a top surface of the first backside via;
    a second epitaxial feature disposed in the third dielectric layer and in contact with a top surface of the second backside via;
    a first frontside contact disposed over and in contact with the first epitaxial feature; and
    a second frontside contact disposed over and in contact with the second epitaxial feature.

16. The semiconductor structure of claim 15,
    wherein the first epitaxial feature comprises silicon (Si) and an n-type dopant, wherein the second epitaxial feature comprises silicon germanium (SiGe) and a p-type dopant.

17. The semiconductor structure of claim 16,
wherein the first rail is coupled to a negative supply voltage (Vss),
wherein the second rail is coupled to a positive supply voltage (Vdd).

18. The semiconductor structure of claim 15, wherein the first frontside contact and the second frontside contact are disposed in the third dielectric layer.

19. The semiconductor structure of claim 15,
wherein the first epitaxial feature and the second epitaxial feature are spaced apart from one another along a direction,
wherein a width of the first epitaxial feature along the direction and greater than a width of the second epitaxial feature along the direction.

20. The semiconductor structure of claim 15, further comprising:
a third epitaxial feature disposed in the third dielectric layer and spaced apart from the second epitaxial feature,
wherein the third epitaxial feature is disposed on the second dielectric layer.

* * * * *